(12) United States Patent
Luo

(10) Patent No.: US 6,879,512 B2
(45) Date of Patent: Apr. 12, 2005

(54) NONVOLATILE MEMORY DEVICE UTILIZING SPIN-VALVE-TYPE DESIGNS AND CURRENT PULSES

(75) Inventor: Jih-Shiuan Luo, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 337 days.

(21) Appl. No.: 10/154,796

(22) Filed: May 24, 2002

(65) Prior Publication Data

US 2003/0218903 A1 Nov. 27, 2003

(51) Int. Cl.$^7$ ................................. G11C 11/00
(52) U.S. Cl. .................... 365/158; 365/173; 365/171; 360/324.1; 360/324.12
(58) Field of Search .................. 365/158, 173, 365/171; 360/324.1, 324.12

(56) References Cited

U.S. PATENT DOCUMENTS

| | | | |
|---|---|---|---|
| 3,582,912 A | 6/1971 | Valin et al. | 340/174 |
| 3,880,602 A | 4/1975 | Valin et al. | 29/195 |
| 5,343,422 A | 8/1994 | Kung et al. | 365/173 |
| 5,432,734 A | 7/1995 | Kawano et al. | 365/158 |
| 5,587,943 A | 12/1996 | Torok et al. | 365/158 |
| 5,695,864 A | 12/1997 | Slonczewski | 428/212 |
| 5,732,016 A | 3/1998 | Chen et al. | 365/158 |
| 5,835,314 A | 11/1998 | Moodera et al. | 360/113 |
| 6,034,887 A | 3/2000 | Gupta et al. | 365/171 |
| 6,233,172 B1 * | 5/2001 | Chen et al. | 365/173 |
| 6,538,921 B2 * | 3/2003 | Daughton et al. | 365/171 |
| 6,580,270 B1 * | 6/2003 | Coehoorn | 324/252 |
| 6,738,237 B2 * | 5/2004 | Gill | 360/324.11 |

FOREIGN PATENT DOCUMENTS

WO    WO 99/62069    12/1999    ........... G11C/11/15

OTHER PUBLICATIONS

Tehrani, Saied, et al.; High Density Pseudo Spin Valve Magnetoresistive RAM, 1998, Int'l NonVolatile Memory Technology Conference.

Everitt, B.A., et al.; Pseudo Spin Valve Magnetoresistive Random Access Memory, 1998, American Vacuum Society.

Tang, D.D., et al.; "An IC Process Compatible Nonvolatile Magnetic RAM", 1995, International Electron Devices meeting.

Tang, D.D., et al.; "Spin–Valve RAM Cell", 1995, IEEE Transactions on Magnetics.

* cited by examiner

*Primary Examiner*—Connie C. Yoha
(74) *Attorney, Agent, or Firm*—Zilka-Kotab, PC; Dominic M. Kotab

(57) ABSTRACT

A memory device includes a plurality of memory elements each having: an antiferromagnetic layer, a first pinned layer coupled to the antiferromagnetic layer, a nonmagnetic spacer layer coupled to the first pinned layer, a second pinned layer coupled to the spacer, and a free layer coupled to the second pinned layer. A plurality of single wiring circuits are provided, each wiring circuit being coupled to a memory element. An addressing mechanism applies current pulses to the memory elements via the single wiring circuits for writing to the memory elements. The addressing mechanism also applies a sense current to the memory elements via the single wiring circuits for reading the memory elements.

20 Claims, 6 Drawing Sheets

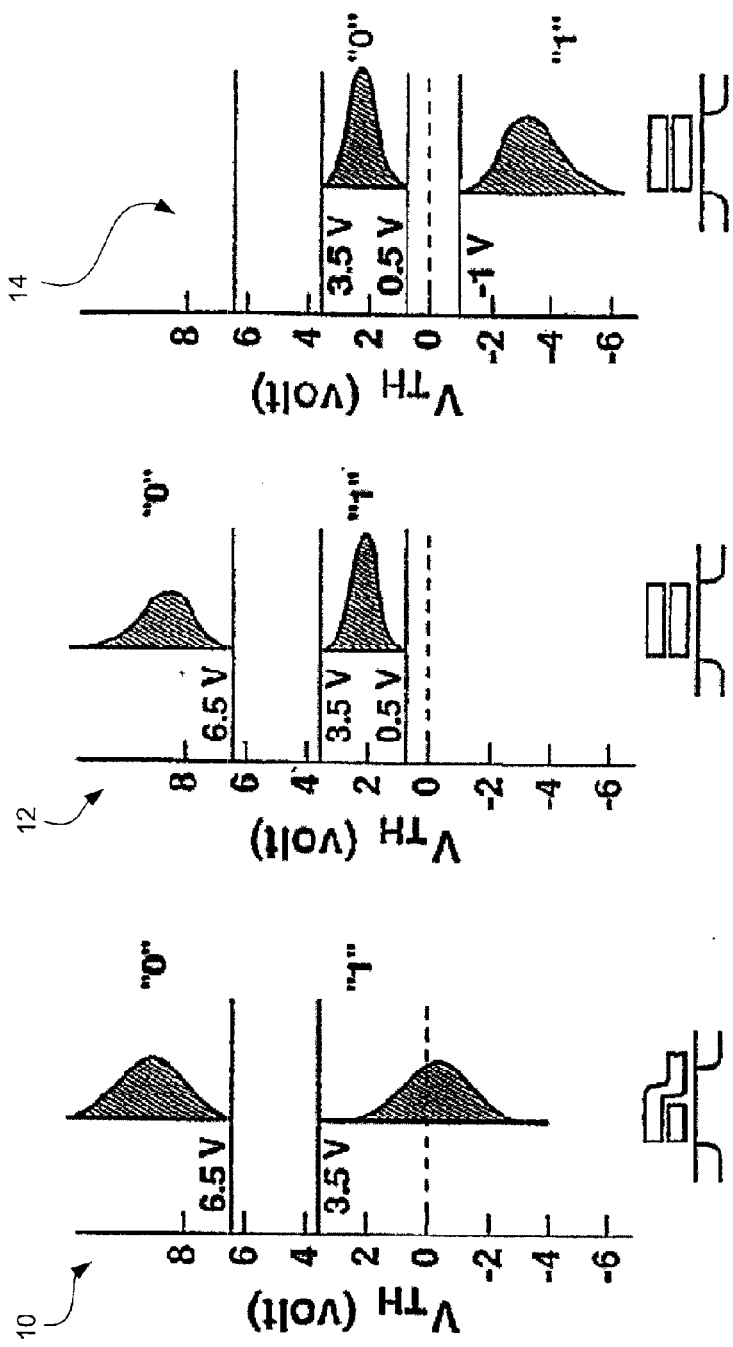
Fig. 1C (Prior Art) NAND EEPROM
Fig. 1B (Prior Art) Flash EEPROM (Self aligned gate)
Fig. 1A (Prior Art) Flash EEPROM (Offset gate)

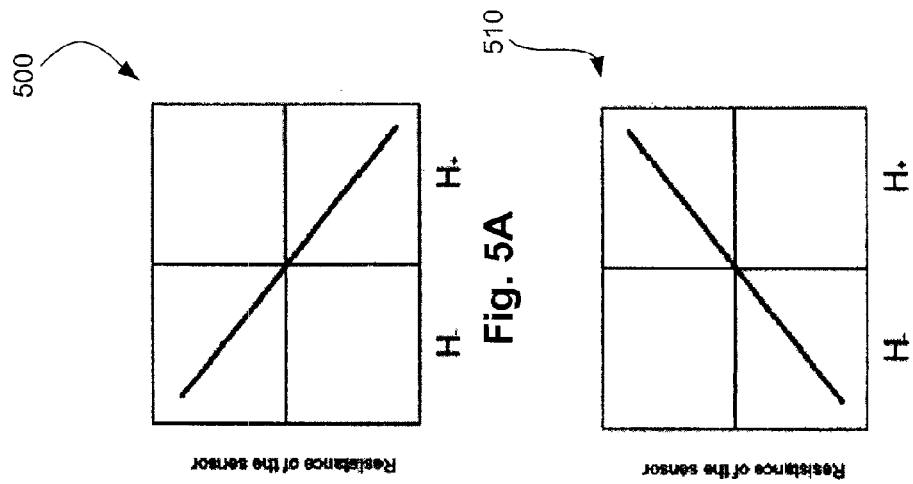
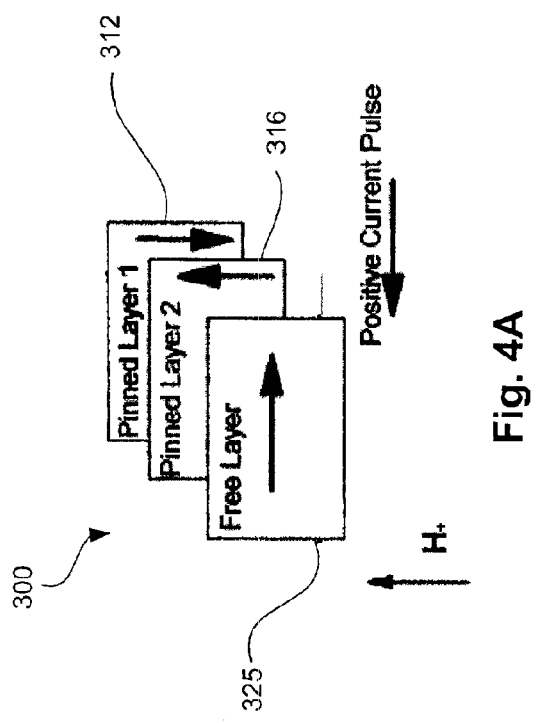
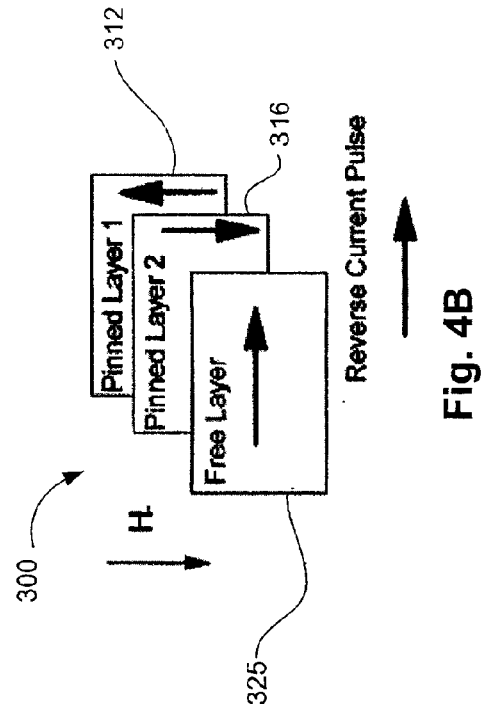

NONVOLATILE MEMORY DEVICE UTILIZING SPIN-VALVE-TYPE DESIGNS AND CURRENT PULSES

FIELD OF THE INVENTION

The present invention relates to memory devices, and more particularly, this invention relates to a spin-valve-type memory device for nonvolatile storage of data.

BACKGROUND OF THE INVENTION

The prior art is replete with nonvolatile memory storage devices. One type is EEPROM (electrically erasable programmable read-only memory), which is user-modifiable read-only memory (ROM) that can be erased and reprogrammed multiple times through the application of higher than normal electrical voltage. One disadvantage of an EEPROM chip, however, is that it has to be erased and reprogrammed in its entirety, not selectively. Another disadvantage is its limited life. More particularly, the number of times it can be reprogrammed is limited to tens or hundreds of thousands of times.

A special form of EEPROM is flash memory, which uses normal PC voltages for erasure and reprogramming. Flash memory, or flash RAM, is a type of constantly-powered nonvolatile memory that can be erased and reprogrammed in units of memory called blocks. It is a variation of EEPROM which, unlike flash memory, can be erased and rewritten at the byte level, which is slower than flash memory updating. When flash memory needs to be rewritten, the flash memory can be written to in block (rather than byte) sizes, making it easy to update.

Flash memory gets its name because the microchip is organized so that a section of memory cells are erased in a single action or "flash." The erasure is caused by Fowler-Nordheim tunneling in which electrons pierce through a thin dielectric material to remove an electronic charge from a floating gate associated with each memory cell. FIG. 1A is a graph 10 illustrating the association of voltage with a binary state for a prior art Flash EEPROM cell having an offset gate. As shown, if the voltage is above 6.5 V, the cell is storing a 0. If the voltage is below 3.5 V, the cell is storing a 1. FIG. 1B is a graph 12 illustrating the association of voltage with a binary state for a prior art Flash EEPROM cell having a self aligned gate.

FIG. 1C is a graph 14 illustrating the association of voltage with a binary state for a prior art NAND EEPROM cell.

MRAM (magnetoresistive random access memory) is a method of storing data bits using magnetic charges instead of the electrical charges used by DRAM (dynamic random access memory). Scientists define a metal as magnetoresistive if it shows a slight change in electrical resistance when placed in a magnetic field.

Conventional random access memory (RAM) computer chips store information as long as electricity flows through them. Once power is turned off, the information is lost unless it has been copied to a hard drive or floppy disk. MRAM, however, retains data after a power supply is cut off. It would be desirable to generate a type of MRAM based on spin electronics, the science behind giant magnetoresistive heads used in disk drives.

One prior art spin-valve type memory device is disclosed in commonly assigned U.S. Pat. No. 5,343,422. In FIGS. 2A and 2B, storage element 20 embodying the invention comprises a suitable substrate 22, such as glass, ceramic or a semiconductor, upon which are deposited a first thin film layer 24 of soft ferromagnetic material, a thin film layer 26 of a nonmagnetic metallic conducting material such as copper, and a second thin film layer 28 of ferromagnetic material.

Note that the storage element 20 is rectangular, and that the easy axis of magnetization is along the length of the storage element. The magnetization direction of magnetic layer 28 is fixed (see arrow 29) to be parallel to the longitudinal dimension of the storage element, such as by exchange coupling with an antiferromagnetic layer 30. However, if preferred, the layer 30 may be eliminated provided layer 28 is of a sufficiently hard magnetic material or has sufficiently high anisotropy to retain its magnetization during state switching operations.

The magnetization of layer 24 is constrained by the uniaxial anisotropy and the shape geometry to lay in the longitudinal direction of element 20, either parallel (see arrow 31, FIG. 2A) or antiparallel (see arrow 33, FIG. 2B) to the fixed direction of magnetization of the layer 28. Switching of the storage element 20 between the "1" state (FIG. 2A) and the "0" state (FIG. 2B) is accomplished by simultaneously applying a transverse field and a longitudinal field to element 20. The longitudinal field is induced by a longitudinal write current 32 in a write line 34 provided by a conductor that extends orthogonal to the length of the storage element 20. The transverse field is induced by a transverse write/sense current 36 flowing lengthwise through the element 20. If desired to increase stability by enhancing the transverse field, additional transverse write/sense current may be provided via an optional separate conductor 37 that extends lengthwise through the storage element and is interposed between substrate 22 and an insulating layer 38 that contacts layer 24, as shown only in FIG. 2A.

However, it would be desirable to allow reorientation of all pinned layers to allow the net magnetic moment of layers 24 and 28 to remain at ~0 upon switching states. It would also be desirable to allow writing to the element 20 with a single write circuit rather than requiring multiple electrical circuits for each memory cell.

DISCLOSURE OF THE INVENTION

A spin-valve-type memory device is provided, and includes an array of memory elements. Each memory element has a free layer and a pinned layer, where the pinned layer is settable to a magnetic orientation upon application of a current pulse thereto. When a positive current pulse is applied to the memory element, the pinned layer is set to a first magnetic orientation representing a first binary state, i.e., a 0 or 1. When a negative current pulse is applied to the memory element, the pinned layer is set to a second magnetic orientation representing a second binary state, i.e., a 1 or 0, where the second binary state is opposite the first binary state. The binary state of each memory element is read by applying a sense current to the memory element for determining a resistance of the memory element. The binary state is in turn determined based on the resistance. The first magnetic orientation provides a different resistivity than the second magnetic orientation and the states are therefore discernable from one another.

In one embodiment, the spin valve includes a second pinned layer. Preferably, the magnetic orientation of the second pinned layer orients itself based upon an orientation of the first pinned layer. When the orientation of the first pinned layer changes, the orientation of the second pinned layer automatically realigns itself to be parallel or antiparallel with the first pinned layer. Ideally, the magnetic orientations of the pinned layers are oriented antiparallel, i.e., are urged towards an antiparallel orientation. An antiparallel orientation reduces the net magnetic moment of the spin valve. The lower magnetic moment results in less demagnetization and is more stable. An external magnetic field may be applied to the array of memory elements for rotating the free layer during application of the sense current.

Preferably, the current pulse and the sense current are applied to each memory element via the same electrical connection. This provides a huge advantage over the prior art in terms of both manufacturing simplicity as well as the on-chip real estate savings. According to one embodiment, each current pulse has a duration of less than 200 nanoseconds. Each current pulse may have a duration of less than 10 nanoseconds.

In one embodiment, the magnetic orientation of the pinned layer is held in place by an antiferromagnetic layer. However, the current pulse generates heat, which heats the pinned layer to a temperature above a blocking temperature of the antiferromagnetic layer which in turn allows the magnetic orientation of the pinned layer to rotate. The array of memory elements can be constructed by semiconductor deposition.

According to another embodiment, the memory device includes a plurality of memory elements each having: an antiferromagnetic layer, a first pinned layer coupled to the antiferromagnetic layer, a nonmagnetic spacer layer coupled to the first pinned layer, a second pinned layer coupled to the spacer, and a free layer coupled to the second pinned layer. A plurality of single wiring circuits are provided, each wiring circuit being coupled to a memory element. An addressing mechanism applies current pulses to the memory elements via the single wiring circuits for writing to the memory elements. The addressing mechanism also applies a sense current to the memory elements via the single wiring circuits for reading the memory elements. Preferably, the spacer layer is dimensioned such that the magnetic orientations of the first pinned layer and the second pinned layer are normally antiparallel each other.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

Prior Art FIGS. 1A, 1B, and 1C illustrate the association of voltage with binary states for prior art EEPROM cells, in accordance with the prior art.

Prior Art

FIG. 4A depicts the magnetic orientation of an illustrative memory element upon application of a positive current pulse.

FIG. 4B illustrates the magnetic orientation of an illustrative memory element upon application of a reverse current pulse.

FIG. 5A depicts a chart showing the effect of resistance on the memory element of FIG. 4A upon application of a positive and negative external magnetic field.

FIG. 5B depicts a chart showing the effect of resistance on the memory element of FIG. 4B upon application of a positive and negative external magnetic field.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

One embodiment of the present invention is a giant magnetoresistance (GMR) element manifesting the GMR effect. In GMR elements, the resistance of the sensed layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR elements using only two layers of ferromagnetic material separated by a layer of non-magnetic electrically conductive material can be generally referred to as spin valve (SV) elements manifesting the GMR effect (SV effect). In a spin valve element, one of the ferromagnetic layers, referred to as the pinned layer, has its magnetization pinned by exchange coupling with an antiferromagnetic (e.g., NiO, FeMn, PtMn, IrMn) layer. The magnetization of the other ferromagnetic layer, referred to as the free layer, however, is not fixed and is free to rotate in response to an applied magnetic field. In spin valve elements, the spin valve effect varies as the cosine of the angle between the magnetization of the pinned layer and the magnetization of the free layer. Data stored by the memory element can be read by determining the resistance of the spin valve element and the corresponding change in the sensed current or voltage.

Figure 2A:
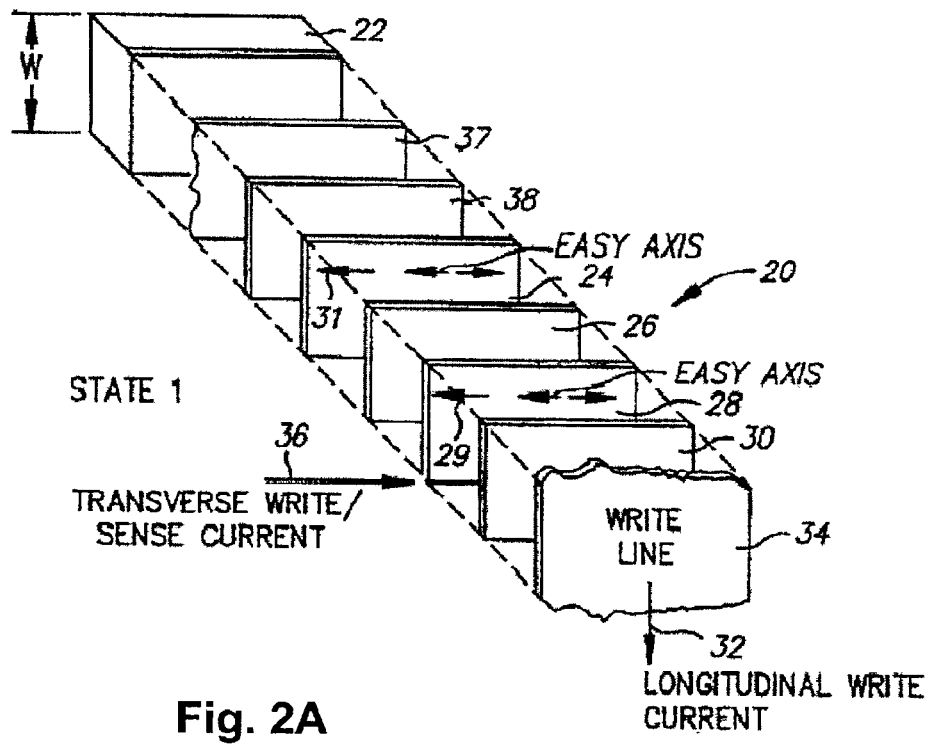
FIGS. 2A and 2B are exploded perspective views depicting the "1" and "0" information states of an MR storage element, in accordance with the prior art.
Figure 2B:
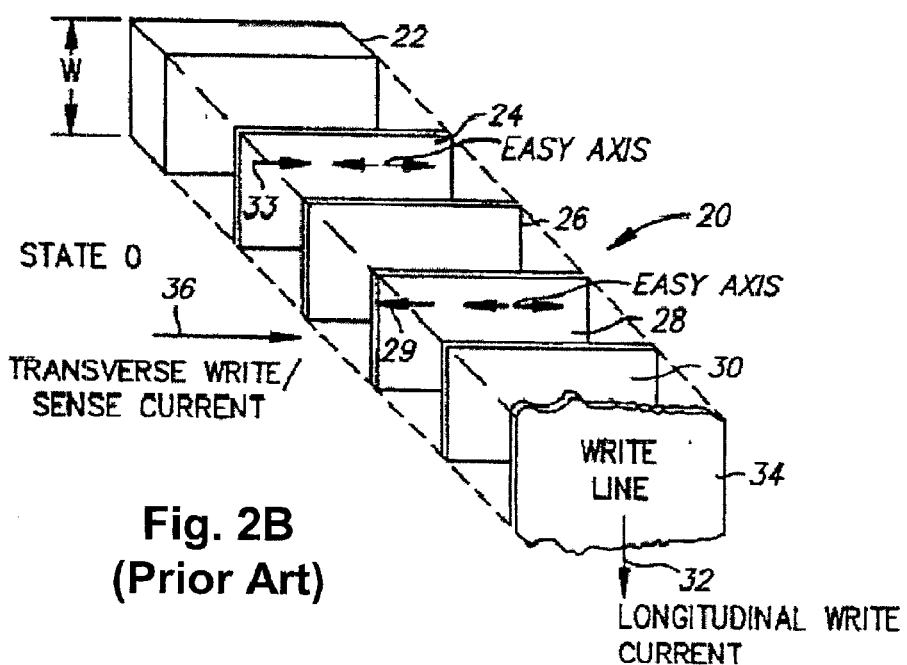
Figure 3A:
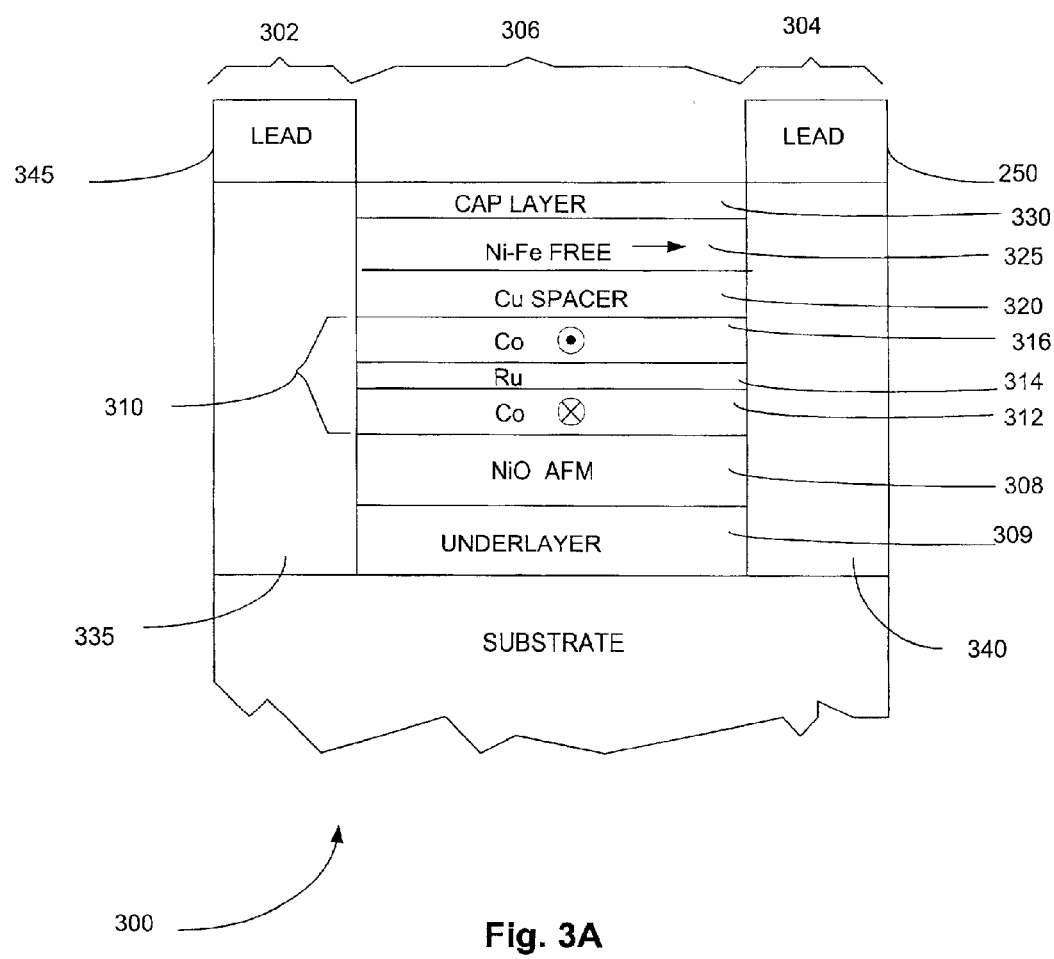
FIG. 3A illustrates a simplified cross-sectional view of the MR memory element according to one embodiment.

The preferred type of spin valve memory element is an anti-parallel (AP)-pinned spin valve element. FIG. 3A shows an exemplary AP-pinned spin valve element 300 (not drawn to scale). The spin valve element 300 has end regions 302 and 304 separated from each other by a central region 306. AP-pinned spin valve element 300 comprises a Ni—Fe free layer 325 separated from a laminated AP-pinned layer 310 by a copper spacer layer 320. The magnetization of the laminated AP-pinned layer 310 is held in place by an antiferromagnetic (AFM) layer 308, or exchange-pinning layer, which can be made of NiO. Beneath the AFM layer 308 is an underlayer 309. The laminated AP-pinned layer 310 includes a first ferromagnetic layer 312 (P1) of cobalt and a second ferromagnetic layer 316 (P2) of cobalt separated from each other by a ruthenium (Ru) anti-parallel coupling spacer layer 314, for example. The AFM layer 308, AP-pinned layer 310, copper spacer 320, free layer 325 and a cap layer 330 are all formed sequentially in the central region 306. Hard bias layers 335 and 340, formed in end regions 302 and 304, provide longitudinal biasing for the free layer 325. Electrical leads 345 and 350 are also formed in end regions 302 and 304, respectively, to provide electrical current from a current source (not shown) to the spin valve element 300. A chip of such memory elements can be surrounded by a coil (not shown), which can apply an external magnetic field to the chip.

The invention is also applicable to one type of spin-valve type sensor, which is called self-pinned (SP) spin valve. In the SP sensor, the AFM is either very thin (30A, for example) or not deposited (consequently, the function of AFM is ineffective) and the remaining sensor design is essentially identical to what is illustrated in FIG. 3A. The pinning direction of the pinned magnetization is set during the wafer manufacturing process.

FIG. 3A depicts a "bottom" spin valve design. The invention is also applicable to "top" spin valve designs. In the top sensor design, the free layer 325 is closer to the substrate than the pinned layers 312, 316.

It is worth noting that the pinned layers described above are not limited to Co as the material choice. Alloys like $Co_{10}Fe_{90}$ and $Co_{40}Fe_{60}$ are potential candidates for pinned layers.

Figure 3B:
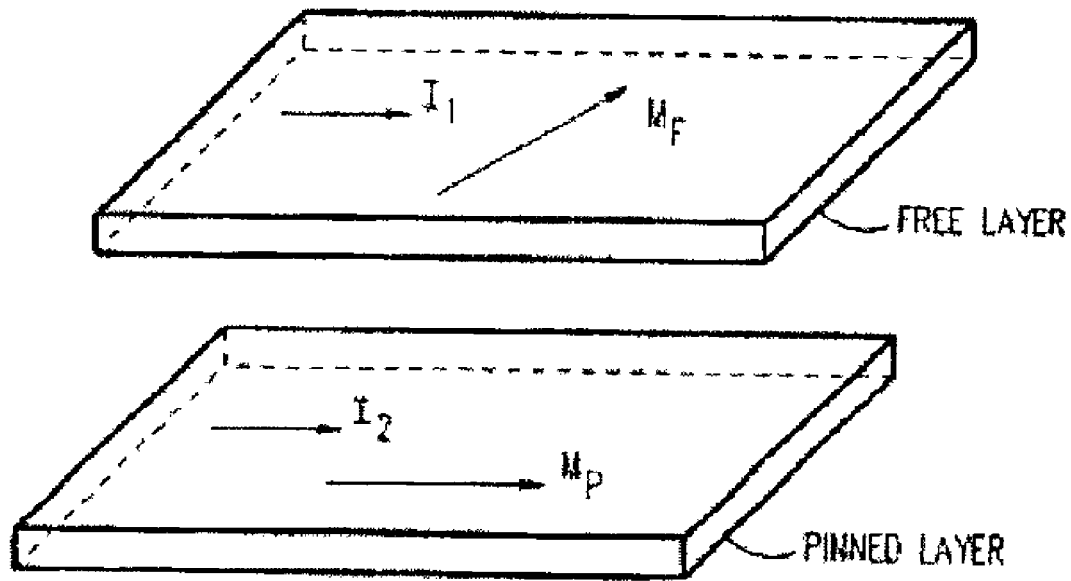
FIG. 3B illustrates the MR element and the placement of the domain wall (under an external magnetic field) of FIG. 3A.
Figure 3C:
FIG. 3C illustrates the cosine of the angle β between the magnetization vector of the pinned layer ($M_P$) and the magnetization vector of the free layer ($M_F$) shown in FIG. 3B.

The GMR effect depends on the angle between the magnetizations of the free and pinned layers. More specifically, the GMR effect is proportional to the cosine of the angle β between the magnetization vector of the pinned layer ($M_P$) and the magnetization vector of the free layer ($M_F$) (Note FIGS. 3B and 3C). In a spin valve element, the electron scattering and therefore the resistance is maximum when the magnetizations of the pinned and free layers are antiparallel, i.e., majority of the electrons are scattered as they try to cross the boundary between the MR layers. On the other hand, electron scattering and therefore the resistance is minimum when the magnetizations of the pinned and free layers are parallel; i.e., majority of electrons are not scattered as they try to cross the boundary between the MR layers.

In other words, there is a net change in resistance of a spin valve element between parallel and antiparallel magnetization orientations of the pinned and free layers. The GMR effect, i.e., the net change in resistance, exhibited by the spin valve element can be in the range of about 4% to 20%, for example.

FIG. 4A depicts the magnetic orientation of an illustrative memory element 300 having three layers, such as the one shown in FIG. 3A. Each memory element 300 is set by applying either a positive or a negative pulse. As shown in FIG. 4A, when a current pulse of 150 nanoseconds and a range of 4 through 24 milliamps (mA) is applied in a positive direction, the current produces a magnetic field, causing the first pinned layer (P1) 312 to flip down as shown in FIG. 4A. Once the pinned layer 1 is flipped, the pinned layer 2 will follow but in reverse direction by the design of the AP-pinning structure. It is worth mentioning that the example illustrated is based on pinned layer 1 as the dominated AP pinned layer; the layer which decides the polarity of pinning. In the case of pinned layer 2 as the dominated layer, the effect of flip-flopping due to current polarity is reversed.

It is also important to note that heat generated from the current pulse may also play an essential role on flip-flopping the pinned layers. Once P1 312 is heated above the blocking temperature of the AFM layer 308, P1 312 is freed from the forces pinning its orientation.

Each element 300 has a stripe height (SH), as known by those in the art. Temperature is sensitive to SH according to Equation 1, below:

$$\Delta T \alpha\ I^2/SH^2 \qquad \text{Equation 1}$$

where
   $\Delta T$=temperature rise due to the bias current,
   I=current, and
   SH=stripe height.

The current pulse generates enough heat to overcome the blocking temperature. The magnetic effect of the current pulse sets P1 312 to the new magnetic state. When the current drops, the temperature cools, and the magnetic effect dissipates, P1 312 becomes pinned again.

Due to the magnetic properties of P1 312 and P2 316, the direction of P1 312 determines the direction of P2 316, and vice versa. Preferably, the anti-parallel coupling spacer layer 314 is dimensioned such that the direction of P2 316 reorients itself to be antiparallel with the orientation of P1 312. The antiparallel orientation of P1 312 and P2 316 is preferred to reduce the net moment. If P1 312 and P2 316 are parallel, demagnetization can result. With a net moment near zero, demagnetization is reduced and the memory element 300 is more stable.

Once the orientations of P1 312 and P2 316 are set as shown in FIG. 4A, a magnetic field can be applied to swing the free layer up or down. If the applied magnetic field rotates the free layer parallel with P2 316, it results in the memory element 300 having a lower resistance. Thus, as shown in FIG. 5A, if a positive magnetic field is applied, the resistance of the element 300 is low when P1 312 and P2 316 are oriented as shown in FIG. 4A.

Inversely, if the magnetic field rotates the free layer antiparallel to P2 316, a higher resistance results when the magnetic field is applied. As shown in the chart 500 of FIG. 5A, if a negative field is applied, the resistance of the element 300 is high when P1 312 and P2 316 are oriented as shown in FIG. 4A. As shown in FIG. 4B, upon applying a reverse current pulse of 150 nanoseconds, for example, the orientation of P1 312 changes to upward. The magnetic forces of P1 312 urge P2 316 into an antiparallel orientation with respect to P1 312, so P2 316 reorients itself based on the orientation of P1 312. Note that P1 312 may be parallel to P2 316 instead of antiparallel as shown in FIG. 4A. Again, this may depend on the thickness of the spacer layer 314 between P1 312 and P2 316.

Referring to the chart 510 shown in FIG. 5B, if a positive magnetic field is applied, the resistance of the element 300 is high when P1 312 and P2 316 are oriented as shown in FIG. 4B. Alternatively, if a negative field is applied, the resistance of the element 300 is low when P1 312 and P2 316 are oriented as shown in FIG. 4B.

Figure 6:
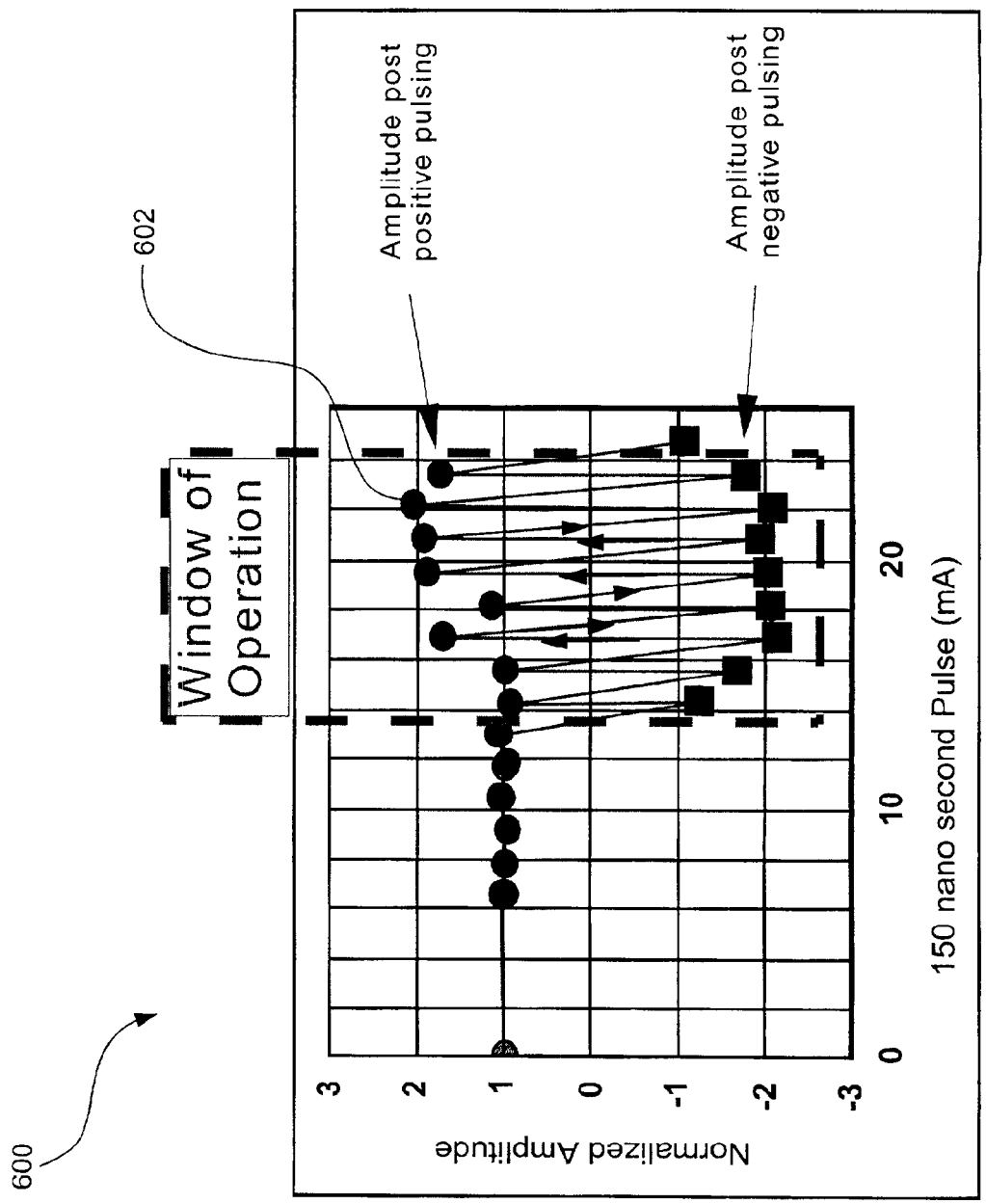
FIG. 6 depicts a chart of normalized amplitude for 150 nanosecond current pulses at varying milliamps of current in an illustrative system.

FIG. 6 depicts a chart 600 of normalized amplitude for 150 nanosecond current pulses 602 at varying milliamps of current in an illustrative system. As shown, by applying current pulses 602 (positive and reverse sequentially) within the window of operation, the resistance of the memory element 300 is switched to higher and lower states in amplitude. For FIG. 6, the amplitude is defined by Equation 2:

$$\text{Amplitude}=I \times R(H_+)-I \times R(H_-) \qquad \text{Equation 2}$$

where
   I=current,
   $R(H_+)$=resistance with positive magnetic field applied, and
   $R(H_-)$=resistance with negative magnetic field applied.

With continued reference to FIG. 6, pulses 602 of 14–24 mA are effective to write to the hypothetical system. This illustrates that the amperage of the current need not be stringently adhered to, but that a wide window of operation (in terms of amperage) is possible for a particular length of pulse. The amount of current that must be applied, of course, will depend on the materials and structure of the particular memory element 300. Thus, for example, shorter pulses (for example, less than 10 nanoseconds) at higher amperage can be applied, as well as longer pulses at lower amperage.

When writing to the memory element 300, the external magnetic field does not need to be applied. Note also that the existence of the magnetic field does not affect the writing, as the torque of the current pulse overcomes any magnetic forces brought to bear on the element 300. The memory element 300 can be erased and/or rewritten by applying another current pulse thereto. When reading the memory element 300, the resistance of the memory element 300 is used to indicate whether the element 300 is storing a 0 or 1. The resistance of a memory element 300 is determined by passing a sense current therethrough. For example, if the sense current indicates that the memory element 300 has a high resistance (as compared to a low resistance state or a reference value, for example), the memory element 300 is storing a 0. Likewise, if the sense current indicates that the memory element 300 has a low resistance, the memory element 300 is storing a 1. The converse can also be used, i.e., high resistance=1, low resistance=0.

An external magnetic field is not always necessary to read the memory element 300. In this case, the sense current is applied through the sensor. Part of the current, which generates magnetic field, is used to rotate the free layer and to determine the resistive state of the memory element 300. To increase the signal to noise, the resistance state can be determined by comparing measurements between positive and negative sensing current. Again, the binary state (0 or 1) can be determined by the resitivity of the memory element 300. This is advantageous for portable memory devices such as can be used for transferring data from a handheld device to a computer, for example.

To store large amounts of data, an array of memory elements is provided, preferably in the form of a memory chip. The memory chip can be created by conventional semiconductor processes, including creating a wafer with millions of memory elements. The wafer is then cut into memory chips.

The scheme for electronically addressing the array can be of any configuration used to address memory, such as a matrix addressing scheme. One important aspect of the present invention is that only a single wiring loop is needed to read and write to a particular memory element in the array. Prior art memory systems require one wiring loop to read, and another to write, which increases the complexity of chip creation as well as increases the final chip size. The embodiments set forth herein are superior to such prior art system in that reading and writing is performed via the same circuitry.

The resultant memory element is very nonvolatile, and is very resistant to external magnetic fields, thereby eliminating the need for magnetic field shields. A very high external magnetic field would be needed to erase or alter the memory. Thus, absent exigent circumstances, the memory element will not change until a pulse is applied.

In use, the memory cell set forth herein can be used in digital cellular phones, digital cameras, LAN switches, PC Cards for notebook computers, digital set-up boxes, embedded controllers, handheld devices, and other devices.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A memory device, comprising:

an array of memory elements, each memory element having a free layer and a pinned layer, the pinned layer being settable to a magnetic orientation upon application of a current pulse thereto;

wherein a positive current pulse applied to the memory element sets the pinned layer to a first magnetic orientation representing a first binary state;

wherein a negative current pulse applied to the memory element sets the pinned layer to a second magnetic orientation representing a second binary state;

wherein a binary state of each memory element is read by applying a sense current to the memory element for determining a resistance of the memory element and determining the binary state based on the resistance;

wherein the pinned layer of each memory element remains in substantially the same magnetic orientation in a nonvolatile manner until another current pulse is applied thereto.

2. The memory device as recited in claim 1, wherein each memory element includes a second pinned layer.

3. The memory device as recited in claim 2, wherein the magnetic orientation of the second pinned layer orients itself based upon an orientation of the pinned layer.

4. The memory device as recited in claim 3, wherein the magnetic orientations of the pinned layers are oriented antiparallel.

5. The memory device as recited in claim 2, wherein an external magnetic field is applied to the array of memory elements for rotating the free layer during application of the sense current.

6. The memory device as recited in claim 1, wherein the current pulse and the sense current are applied to each memory element via the same electrical connection.

7. The memory device as recited in claim 1, wherein each current pulse has a duration of less than 200 nanoseconds.

8. The memory device as recited in claim 1, wherein each current pulse has a duration of less than 10 nanoseconds.

9. The memory device as recited in claim 1, wherein the magnetic orientation of the pinned layer is held in place by an antiferromagnetic layer, wherein the current pulse generates heat, wherein the pinned layer is heated to above a blocking temperature of the antiferromagnetic layer.

10. The memory device as recited in claim 1, wherein the array of memory elements is constructed by semiconductor deposition.

11. The memory device as recited in claim 1, wherein the pinned layer is self-pinned.

12. A memory device, comprising:

a plurality of memory elements each having:
an antiferromagnetic layer;
a first pinned layer coupled to the antiferromagnetic layer;
a nonmagnetic spacer layer coupled to the first pinned layer;
a second pinned layer coupled to the spacer; and
a free layer coupled to the second pinned layer;

a plurality of single wiring circuits, each wiring circuit being coupled to a memory element; and an addressing mechanism for applying current pulses to the memory elements via the single wiring circuits for writing to the memory elements, the addressing mechanism also applying a sense current to the memory elements via the single wiring circuits for reading the memory elements, wherein the current pulses set a magnetic orientation of the pinned layers of each memory element, the pinned layers remaining in substantially the same magnetic orientation in a nonvolatile manner until another current pulse is applied thereto.

13. The memory device as recited in claim 12, wherein a positive current pulse applied to the memory element sets the pinned layer to a first magnetic orientation representing a first binary state, wherein a negative current pulse applied to the memory element sets the pinned layer to a second magnetic orientation representing a second binary state.

14. The memory device as recited in claim 12, wherein the sense current is used to determine a resistance of a memory element, wherein a binary state of the memory element is determined based on the resistance.

15. The memory device as recited in claim 12, wherein the spacer layer is dimensioned such that the magnetic orientations of the first pinned layer and the second pinned layer are normally antiparallel each other.

16. The memory device as recited in claim 12, wherein, for each memory element: the magnetic orientation of the pinned layer is hold in place by an antiferromagnetic layer, wherein the current pulse generates heat, wherein the pinned layer is heated to above a blocking temperature of the antiferromagnetic layer.

17. A method for storing data, comprising:

selectively applying a current pulse to each of a plurality of memory elements, each memory element having a free layer and a pinned layer, wherein a positive current pulse sets the pinned layer to a first magnetic orientation that represents a first binary state, wherein a negative current pulse sets the pinned layer to a second magnetic orientation that represents a second binary state, wherein the pinned layer of each memory element remains in substantially the same magnetic orientation in a nonvolatile manner until another current pulse is applied thereto;

applying a sense current to the memory elements;

measuring the resistance of each memory element; and determining the binary state of each memory element based on the resistance.

18. The method as recited in claim 17, wherein the current pulse and the sense current are applied to each memory element via the same electrical connection.

19. The method as recited in claim 17, wherein the magnetic orientation of the pinned layer is held in place by an antiferromagnetic layer, wherein the current pulse generates heat, wherein the pinned layer is heated to above a blocking temperature of the antiferromagnetic layer.

20. The memory device as recited in claim 1, further comprising a matrix addressing circuitry for selectively addressing each memory element in the array of memory elements.

* * * * *

UNITED STATES PATENT AND TRADEMARK OFFICE
CERTIFICATE OF CORRECTION

PATENT NO. : 6,879,512 B2  Page 1 of 1
DATED : April 12, 2005
INVENTOR(S) : Luo

It is certified that error appears in the above-identified patent and that said Letters Patent is hereby corrected as shown below:

Column 8,
Line 11, change "clement" to -- element --;

Column 9,
Line 30, change "hold" to -- held --.

Signed and Sealed this

Seventh Day of June, 2005

JON W. DUDAS
*Director of the United States Patent and Trademark Office*